(12) United States Patent
Möllmer et al.

(10) Patent No.: US 10,333,032 B2
(45) Date of Patent: Jun. 25, 2019

(54) OPTOELECTRONIC LIGHT-EMITTING COMPONENT AND LEADFRAME ASSEMBLAGE

(71) Applicants: OSRAM Opto Semiconductors GmbH, Regensburg (DE); Karoline Bernhard-Hofer

(72) Inventors: Frank Möllmer, Matting Bei Pentling (DE); Markus Arzberger, Regensburg (DE); Michael Schwind, Sinzing (DE); Thomas Höfer, Lappersdorf (DE); Martin Haushalter, Regensburg (DE); Mario Wiengarten, Wörth (DE); Tilman Eckert, Penang (MY)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/915,873

(22) PCT Filed: Aug. 8, 2014

(86) PCT No.: PCT/EP2014/067092
§ 371 (c)(1),
(2) Date: Mar. 1, 2016

(87) PCT Pub. No.: WO2015/039808
PCT Pub. Date: Mar. 26, 2015

(65) Prior Publication Data
US 2016/0218248 A1    Jul. 28, 2016

(30) Foreign Application Priority Data
Sep. 19, 2013 (DE) .................. 10 2013 110 355

(51) Int. Cl.
*H01L 33/48* (2010.01)
*H01L 33/58* (2010.01)
(Continued)

(52) U.S. Cl.
CPC ........ *H01L 33/486* (2013.01); *H01L 21/4817* (2013.01); *H01L 21/4821* (2013.01);
(Continued)

(58) Field of Classification Search
CPC .................................................. H01L 33/486
See application file for complete search history.

(56) References Cited

U.S. PATENT DOCUMENTS 5,078,209 A * 1/1992 Kerkman .............. F28D 9/0012
165/167
6,459,130 B1  10/2002 Arndt et al.
(Continued)

FOREIGN PATENT DOCUMENTS

CN     101278414 A    10/2008
CN     102376853 A    3/2012
(Continued)

*Primary Examiner* — Brigitte A Paterson
(74) *Attorney, Agent, or Firm* — Slater Matsil, LLP (57) ABSTRACT

An embodiment optoelectronic semiconductor device includes a housing having a leadframe with a first and second connection conductor. The housing further has a housing body surrounding the leadframe in one or more regions. The housing body extends in a vertical direction between a mounting side of the housing body and a front side of the housing body opposite the mounting side. The first connection conductor has a recess. A semiconductor chip configured to generate radiation is arranged within the housing, and the semiconductor chip is disposed in the recess and is affixed to the first connection conductor within the recess. A side face of the recess forms a reflector for reflecting the generated radiation. The first connection conductor protrudes from the housing body at the mounting (Continued)

side. The semiconductor chip is, in at least some regions, free of an encapsulation material adjoining the semiconductor chip.

14 Claims, 5 Drawing Sheets

(51) Int. Cl.
  *H01L 33/60*  (2010.01)
  *H01L 33/62*  (2010.01)
  *H01L 23/00*  (2006.01)
  *H01L 21/48*  (2006.01)
  *H01L 25/16*  (2006.01)
  *H01L 29/861*  (2006.01)
  *H01L 33/54*  (2010.01)
  *H01L 33/64*  (2010.01)

(52) U.S. Cl.
  CPC ............ *H01L 24/97* (2013.01); *H01L 25/165* (2013.01); *H01L 25/167* (2013.01); *H01L 29/861* (2013.01); *H01L 33/54* (2013.01); *H01L 33/58* (2013.01); *H01L 33/60* (2013.01); *H01L 33/62* (2013.01); *H01L 24/48* (2013.01); *H01L 33/647* (2013.01); *H01L 2224/48091* (2013.01); *H01L 2224/48247* (2013.01); *H01L 2224/49113* (2013.01); *H01L 2924/00014* (2013.01); *H01L 2924/12041* (2013.01); *H01L 2924/181* (2013.01); *H01L 2933/005* (2013.01); *H01L 2933/0066* (2013.01)

(56) References Cited

U.S. PATENT DOCUMENTS

| | | | |
|---|---|---|---|
| 7,948,694 B2 | 5/2011 | Bogner et al. | |
| 8,399,904 B2 | 3/2013 | Lee | |
| 9,000,548 B2 | 4/2015 | Jaus et al. | |
| 2003/0107316 A1 | 6/2003 | Murakami et al. | |
| 2004/0058478 A1* | 3/2004 | Islam | H01L 21/561 438/123 |
| 2007/0085103 A1 | 4/2007 | Nishioka et al. | |
| 2007/0176190 A1 | 8/2007 | Takayama | |
| 2007/0200127 A1* | 8/2007 | Andrews | H01L 33/486 257/98 |
| 2008/0083931 A1 | 4/2008 | Bando et al. | |
| 2008/0297020 A1 | 12/2008 | Wanninger et al. | |
| 2009/0045421 A1 | 2/2009 | Ho et al. | |
| 2010/0001306 A1 | 1/2010 | Park et al. | |
| 2010/0008085 A1 | 1/2010 | Ivey et al. | |
| 2010/0102345 A1* | 4/2010 | Kong | H01L 33/486 257/98 |
| 2010/0290233 A1 | 11/2010 | Okazaki | |
| 2012/0018762 A1 | 1/2012 | Abe | |
| 2012/0217526 A1* | 8/2012 | Kumura | H01L 33/486 257/98 |
| 2013/0223032 A1 | 8/2013 | Klein et al. | |
| 2013/0328074 A1* | 12/2013 | Lowes | H01L 27/15 257/89 |
| 2015/0024524 A1* | 1/2015 | Yao | H01L 27/156 438/26 |

FOREIGN PATENT DOCUMENTS

| | | |
|---|---|---|
| DE | 19536454 A1 | 4/1997 |
| DE | 10303455 A1 | 8/2004 |
| DE | 102004051379 A1 | 3/2006 |
| DE | 102005061798 A1 | 4/2007 |
| DE | 102010045596 A1 | 3/2012 |
| DE | 102010050343 A1 | 5/2012 |
| JP | H11345912 A | 12/1999 |
| JP | 2008282932 A | 11/2008 |
| TW | 315528 B1 | 9/1997 |
| WO | 2009080354 A1 | 7/2009 |
| WO | 2012155984 A1 | 11/2012 |

\* cited by examiner

OPTOELECTRONIC LIGHT-EMITTING COMPONENT AND LEADFRAME ASSEMBLAGE

This patent application is a national phase filing under section 371 of PCT/EP2014/067092, filed on Aug. 8, 2014, which claims the priority of German patent application 10 2013 110 355.3, filed Sep. 19, 2013, each of which is incorporated herein by reference in its entirety.

TECHNICAL FIELD

The present application relates to an optoelectronic semiconductor device and to a method for producing a leadframe assemblage, which is provided especially for the production of optoelectronic semiconductor devices.

BACKGROUND

As increasing demands are made of the optical power of semiconductor devices such as light-emitting diodes, so too are increasing demands made of the dissipation of the resulting heat loss. In addition, the semiconductor devices should be mountable as economically as possible using standard methods such as, for example, reflow soldering. Furthermore, designs are often required in which the radiation is emitted into as small as possible a solid angle.

SUMMARY

An embodiment device defines a semiconductor device which is distinguished by good optoelectronic properties and at the same time by good dissipation of heat. Furthermore, an embodiment method for which the production of optoelectronic semiconductor devices is simplified.

According to at least one embodiment of the optoelectronic semiconductor device, the semiconductor device has a semiconductor chip provided for generating radiation. The semiconductor chip is especially in the form of a high-power semiconductor chip, especially in the form of a high-power luminescent diode. A high-power semiconductor chip is understood as being a semiconductor chip which is distinguished by an electrical power consumption of at least 0.5 Watt.

The semiconductor chip has, in particular, an active region provided for generating radiation. The semiconductor chip, especially the active region, has, for example, a III-V compound semiconductor material.

According to at least one embodiment of the optoelectronic semiconductor device, the semiconductor device has a housing. In particular, the semiconductor chip is arranged in the housing. The housing especially has a leadframe having a first connection conductor and having a second connection conductor. The first connection conductor and the second connection conductor are provided for external electrical contacting of the optoelectronic semiconductor device.

According to at least one embodiment of the optoelectronic semiconductor device, the housing has a housing body. The housing body surrounds, in particular, the leadframe at least in some regions. For example, the housing body extends in a vertical direction between a mounting side and a front side. The housing body is, for example, in the form of a molded plastics body. In particular, the housing body is radiation-opaque to the radiation to be generated in the optoelectronic semiconductor device. For example, the first connection conductor and the second connection conductor protrude from the housing body on opposite sides.

According to at least one embodiment of the optoelectronic semiconductor device, the leadframe, especially the first connection conductor, has a recess in which the semiconductor chip is affixed to the leadframe, especially to the first connection conductor. For example, the semiconductor chip is affixed to the leadframe by means of an adhesive bond.

According to at least one embodiment of the optoelectronic semiconductor device, a side face of the recess forms a reflector for the radiation emitted by the semiconductor chip during operation. The recess is especially configured so that radiation incident on the side face is diverted towards a main radiation axis of the optoelectronic semiconductor device. In other words, the radiation incident on the side face, after being diverted at the side face, runs at a smaller angle with respect to the main radiation axis than before being diverted.

According to at least one embodiment of the optoelectronic semiconductor device, the first connection conductor protrudes from the housing body on the mounting side. When the optoelectronic semiconductor device has been mounted, the heat loss generated in the semiconductor chip can be dissipated directly via the first connection conductor into a connection carrier, for example a circuit board. The heat loss therefore does not need to pass through the housing body, which typically has a comparatively low thermal conductivity.

According to at least one embodiment of the optoelectronic semiconductor device, the semiconductor chip, at least in some regions, especially on a radiation exit surface remote from the mounting side, is free of an encapsulation material adjoining the semiconductor chip. In particular, the radiation exit surface is not adjoined by a material which also covers the side faces of the semiconductor chip. On the radiation exit surface, however, a radiation conversion element, for example, can be provided, which converts primary radiation generated by the semiconductor chip having a first peak wavelength completely or partly into secondary radiation having a second peak wavelength.

In particular, the semiconductor chip is not completely surrounded by an encapsulation material. Furthermore, a connecting lead by means of which the semiconductor chip is electrically conductively connected to the leadframe, for example a bond wire, can also be exposed at least in some regions.

In at least one embodiment of the optoelectronic semiconductor device, the semiconductor device has a semiconductor chip provided for generating radiation and a housing in which the semiconductor chip is arranged. The housing has a leadframe having a first connection conductor and a second connection conductor. The housing has a housing body which surrounds the leadframe in some regions, the housing body extending in a vertical direction between a mounting side and a front side. The first connection conductor has a recess in which the semiconductor chip is affixed to the first connection conductor. A side face of the recess forms a reflector for the radiation emitted by the semiconductor chip during operation. The first connection conductor protrudes from the housing body on the mounting side. The semiconductor chip is at least in some regions free of an encapsulation material adjoining the semiconductor chip.

The first connection conductor having the recess therefore serves both for efficient dissipation of heat and for beam-shaping of the radiation emitted by the semiconductor chip.

Even without an optical element downstream of the semiconductor chip, the semiconductor device has a comparatively narrow-angled radiation characteristic. Furthermore, by dispensing with an encapsulation of the semiconductor chip the reliability of the semiconductor device can be increased. In addition, the mechanical load on the connecting lead, for example a bond wire, is also reduced.

According to at least one embodiment of the optoelectronic semiconductor device, the thickness of the leadframe in the region of the side face of the recess is smaller than in the region of a base surface of the recess. For example, the thickness in the region of the side face is between 50 percent and 90 percent, inclusive, of the thickness in the region of the base surface.

According to at least one embodiment of the optoelectronic semiconductor device, the semiconductor device is surface-mountable. It is therefore an SMD (surface-mounted device). In particular, the semiconductor device is mountable by means of a reflow soldering process.

According to at least one embodiment of the optoelectronic semiconductor device, a vertical dimension of the recess is at least three times as great as a vertical dimension of the semiconductor chip. In a sectional view through the semiconductor device, the semiconductor chip is especially arranged completely inside the recess. By means of the side face of the recess serving as reflector, the radiation emitted by the optoelectronic semiconductor device can thus be limited to a comparatively small solid angle, even without a downstream optical element.

According to at least one embodiment of the optoelectronic semiconductor device, opposing side faces of the recess form an opening angle of between 50° and 90°, inclusive, especially between 60° and 80°, inclusive.

By virtue of such an opening angle, especially in conjunction with a vertical dimension of the recess that is at least three times as great as the vertical dimension of the semiconductor chip, an efficient narrowing of the angle of radiation may be achieved even without an encapsulation downstream of the semiconductor chip and/or a downstream optical element. For applications for which a larger angle of radiation is desirable, the vertical dimension of the recess relative to the semiconductor chip and/or the opening angle between opposing side faces can, in a departure therefrom, be varied within a wide range.

According to at least one embodiment of the optoelectronic semiconductor device, the housing body has on the front side at least one fixing device for a cover. The fixing device can be, for example, in the form of a recess in the housing body.

According to at least one embodiment of the optoelectronic semiconductor device, the semiconductor device has a cover through which radiation generated in the semiconductor chip exits. The cover is especially spaced apart from the semiconductor chip in the vertical direction. For example, an intermediate space between the semiconductor chip and the cover is free of solid matter. In other words, between the radiation exit surface of the semiconductor chip and the cover the radiation generated in the semiconductor chip passes through a free propagation region.

The cover can be, for example, in the form of a flat plate or in the form of an optical element. For example, the cover is in the form of a prefabricated optical element. For example, the optical element is in the form of a converging lens. By means of the optical element, the angle of radiation, in addition to being narrowed by the side faces of the recess, can undergo even further narrowing. For example, the cover has a further fixing device which is insertable into the fixing device of the housing body, or vice versa.

According to at least one embodiment of the optoelectronic semiconductor device, the semiconductor device has an electrostatic discharge (ESD) protection element. The ESD protection element is provided for protecting the semiconductor chip against electrostatic discharge. For example, the ESD protection element is in the form of a protection diode the throughput direction of which is oriented antiparallel to the throughput direction of semiconductor chip. The ESD protection element is therefore integrated into the optoelectronic semiconductor device so that an external ESD protection element may be dispensed with.

A method for producing a leadframe assemblage having a plurality of device regions comprises, according to at least one embodiment, the provision of a base material for the leadframe assemblage. For example, the base material can be a flat metal sheet, for example a copper sheet. The base material can be single-layered or multi-layered. For example, the base material can have a reflectivity-increasing coating. For example, the coating has a reflectivity of at least 60% in respect of the radiation to be generated, for example in respect of radiation in the visible spectral range. Such a coating can comprise, for example, silver or a different material having a high reflectivity especially in the visible spectral range or can consist of such a material.

According to at least one embodiment of the method, the method comprises a step in which recesses are formed in the base material by means of a deep-drawing process. By means of a deep-drawing process, as compared with a structuring process such as embossing, recesses having comparatively large vertical dimensions may be formed with great reliability and dimensional accuracy.

According to at least one embodiment of the method, the method comprises forming connection conductors so that each device region has a first connection conductor and a second connection conductor. In the finished leadframe assemblage the first connection conductors and the second connection conductors are still mechanically stably joined to one another.

In at least one embodiment of the method for producing a leadframe assemblage, the method comprises providing a base material for the leadframe assemblage, forming recesses in the base material by means of a deep-drawing process and forming connection conductors, so that each device region has a first connection conductor and a second connection conductor. The forming of the recesses and the forming of the connection conductors need not necessarily be carried out in the order in which they are enumerated.

According to at least one embodiment of the method, the base material is provided with the reflectivity-increasing coating after the recesses have been formed in the base material. The coating of the base material is therefore effected only after the recesses have been formed. It is thus made easier to cover the entire surface of the side faces of the recesses with reflecting material. In principle, however, it is also conceivable for the base material to be provided with the coating before the recesses are formed.

According to at least one embodiment of the method, the recesses are formed by means of impact extrusion. It has been found that impact extrusion is especially suitable for producing recesses having a comparatively large vertical dimension. In comparison therewith, conventional methods for structuring base material for leadframes, such as, for example, embossing, allow only very small vertical dimensions, so that recesses serving as reflectors cannot readily be produced.

To produce a plurality of housings for optoelectronic semiconductor devices, the leadframe assemblage can in some regions be overmolded with a molding compound to form housing bodies. The leadframe assemblage can further be singulated, so that each housing has a housing body and a leadframe having a first connection conductor and a second connection conductor.

To produce an optoelectronic semiconductor device, a semiconductor chip can be positioned in such a housing. It is also conceivable for the semiconductor chips to be positioned in the housings before singulation of the leadframe assemblage is carried out.

The described method is especially suitable for producing an optoelectronic semiconductor device described above. Features described in connection with the semiconductor device can therefore be employed also in respect of the method, and vice versa.

Further features, arrangements and advantageous aspects will be found in the following description of exemplified embodiments in conjunction with the Figures. In the Figures, elements that are identical or similar or have identical action are denoted by the same reference symbols.

BRIEF DESCRIPTION OF THE DRAWINGS

The Figures are in each case diagrammatic drawings and are therefore not necessarily true to scale. In particular, the size of individual elements and especially layer thicknesses may have been exaggerated in the drawings for the purpose of better clarity and/or better understanding.

In the drawings.

DETAILED DESCRIPTION OF ILLUSTRATIVE EMBODIMENT

Figure 1A:
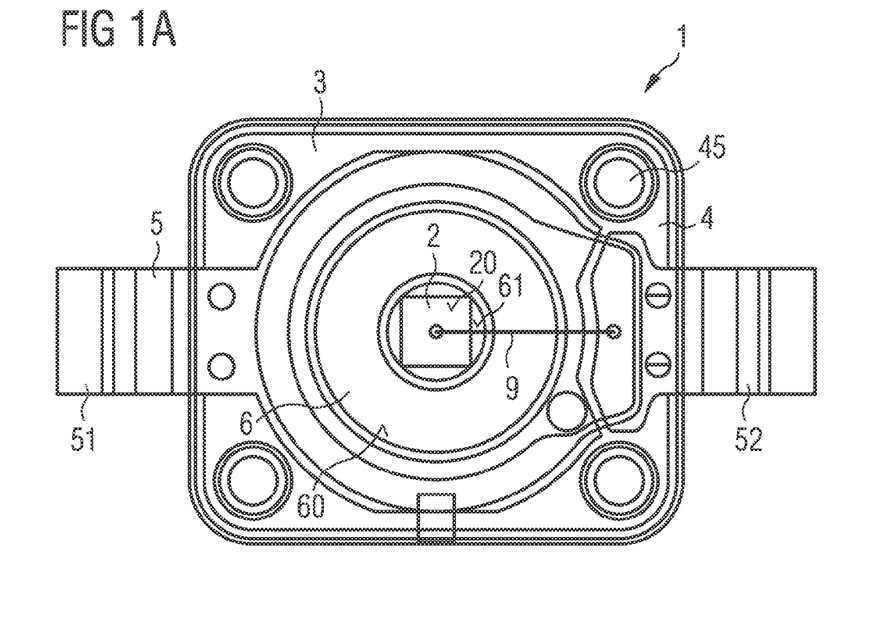
FIGS. 1A and 1B, 2A and 2B, 3A and 3B, and 4A and 4B in each case show an exemplified embodiment of an optoelectronic semiconductor device in a diagrammatic plan view (FIGS. 1A, 2A, 3A and 4A) and an associated sectional view (FIGS. 1B, 2B, 3B and 4B)
Figure 1B:
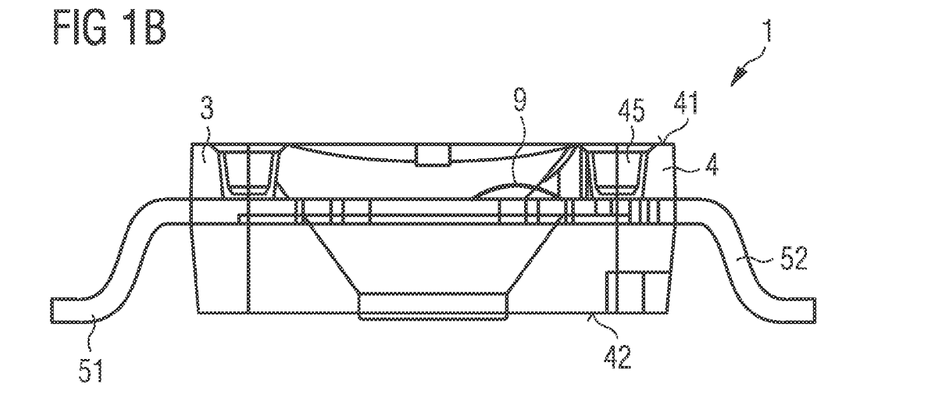

A first exemplified embodiment of a semiconductor device is shown diagrammatically in FIGS. 1A and 1B. The semiconductor device 1 has a semiconductor chip 2 which is arranged in a housing 3.

The housing 3 comprises a leadframe 5 having a first connection conductor 51 and a second connection conductor 52. The housing further comprises a housing body 4, which extends in a vertical direction between a front side 41 and a mounting side 42. The first connection conductor 51 and the second connection conductor 52 protrude from the housing body 4 on opposite sides. Those protruding regions of the connection conductors serve for the external electrical contacting of the semiconductor device 1. The first connection conductor 51 and the second connection conductor 52 each extend in a wing-like manner into the region projecting from the housing body 4. Such a configuration of the connection conductors enables the solderability of the semiconductor device to be improved.

The first connection conductor 51 and the second connection conductor 52 are electrically connected to the semiconductor chip 2 via a first contact and a second contact, respectively, of the semiconductor chip. In the exemplified embodiment illustrated, the semiconductor chip has a rear-side contact, which is connected to the first connection conductor, and a front-side contact, which is connected to the second connection conductor 52 via a connecting lead 9. In a departure therefrom it is also conceivable, however, for the semiconductor chip to have, for example, two front-side contacts each connected via a connecting lead to the associated connection conductor.

The first connection conductor 51 has a recess in which the semiconductor chip 2 is affixed, for example by means of an adhesive bond or solder. In the region of the recess, the first connection conductor 51 protrudes from the housing body 4 on the mounting side 42. That protruding region provides a thermal connection for the semiconductor device and ensures that the waste heat generated in the semiconductor chip 2 is efficiently dissipated directly via the first connection conductor 51.

A side face 60 of the recess 6 forms a reflector for the radiation generated in the semiconductor chip during operation of the semiconductor device. The vertical dimension of the recess is large in comparison with the vertical dimension of the semiconductor chip. For example, the vertical dimension of the recess is at least three times as great as the vertical dimension of the semiconductor chip. In particular, the vertical dimension of the recess is at least one millimeter. For example, the vertical dimension can be between 1 mm and 3 mm, inclusive, for example 1.5 mm. The semiconductor chip has, for example, a thickness of between 80 µm and 250 µm, inclusive.

The semiconductor device 1 is furthermore free of an encapsulation surrounding the semiconductor chip 2. In particular, a radiation exit surface 20 of the semiconductor chip is not adjoined by an encapsulation material. On the radiation exit surface 20 of the semiconductor chip 2 there can be provided a radiation conversion element for at least partial conversion of the primary radiation generated in the semiconductor chip (not explicitly illustrated).

In sectional view, opposing regions of the side face 60 of the recess enclose an opening angle 62 (see FIG. 5B) in some embodiments, of between 50° and 90°, inclusive, and in some embodiments, between 60° and 80°, inclusive. It has been found that the radiation generated in the semiconductor chip can in that way radiate especially efficiently into a comparatively narrow solid angle, without a downstream optical element or a beam-shaping encapsulation of the semiconductor chip being required for that purpose. In addition, the omission of downstream optical elements simplifies the structure of an apparatus having such a semiconductor device and the mounting of the semiconductor device by soldering.

In the region of the side face 60, the thickness of the leadframe 5 is smaller than in the region of a base surface 61. It has been found that such a leadframe can be produced in a simple and reliable way by means of a deep-drawing process, especially by impact extrusion.

In the exemplified embodiment illustrated, the housing body 4 has a fixing device 45 which is provided for affixing an optical element or a cover. In the exemplified embodiment, the fixing device is formed by four recesses each arranged in a corner of the housing body 4. The fixing device 45 can alternatively also be formed by a snap-in device or a locking device.

In the exemplified embodiment illustrated, the beam-shaping in the semiconductor device takes place exclusively by means of the side face 60 of the recess 6 of the leadframe 5. The semiconductor device therefore has no temperature-sensitive parts such as, for example, plastics lenses. The risk of damage to the semiconductor device during a soldering process, for example a reflow soldering process for affixing the semiconductor device to a connection carrier, for example a circuit board, is thus reduced.

The semiconductor chip 2 is in the form of a high-power luminescent diode, especially in the form of a high-power light-emitting diode. The power consumption of the semiconductor chip is especially at least 0.5 Watt and can also be 1 Watt or more than 1 Watt.

The semiconductor chip 2, especially an active region of the semiconductor chip provided for generating radiation, has, for example, a III-V compound semiconductor material, for example a semiconductor material based on GaN, GaP or GaAs.

The waste heat generated in the semiconductor chip can be effected in an especially efficient way directly via the first connection conductor 51 extending through the housing body 4. The optoelectronic semiconductor device 1 is therefore a surface-mountable semiconductor device, which can be mounted by means of a soldering process, and at the same time allows high optical outputs which can be emitted in a comparatively narrow solid angle.

Figure 2A:
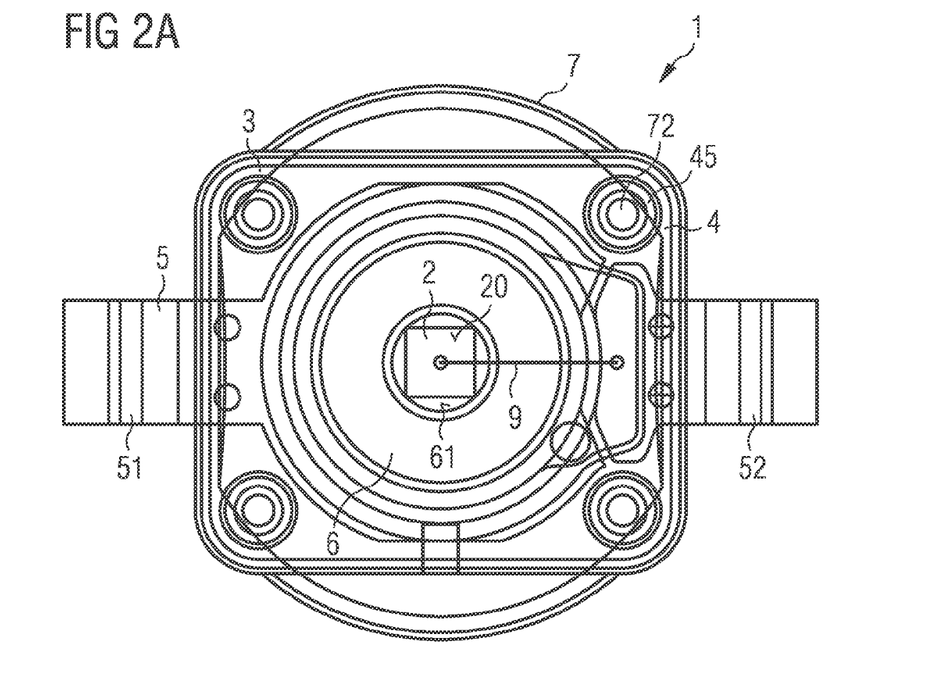
Figure 2B:
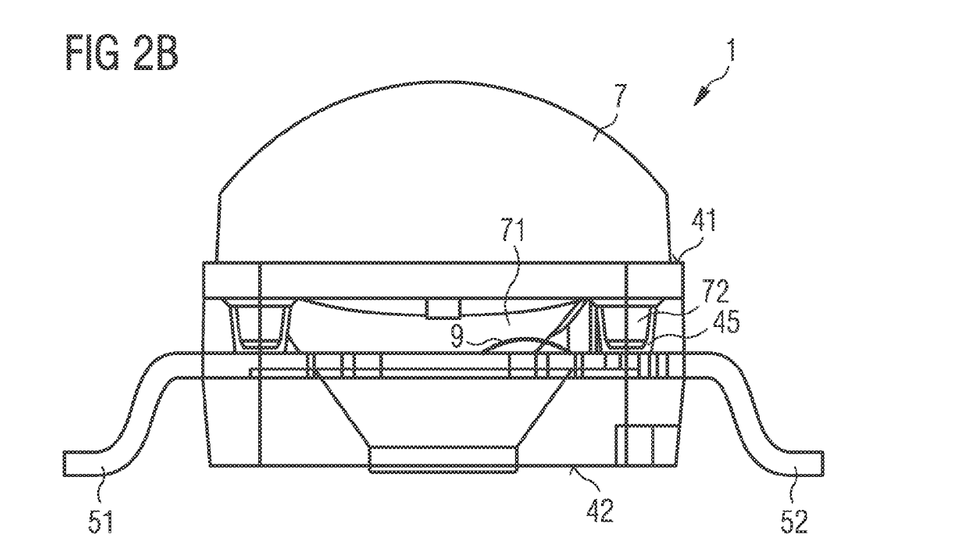

A second exemplified embodiment of a semiconductor device 1 is illustrated in FIGS. 2A and 2B. This second exemplified embodiment differs from the first exemplified embodiment described in conjunction with FIGS. 1A and 1B in that a cover 7 in the form of an optical element is affixed to the housing body 4. The cover 7 has a further fixing device 72 which engages in the fixing device 45 of the housing body 4. This type of fixing makes it simpler for the optical element to be mounted quickly and in alignment in relation to the semiconductor chip. The optical element can, however, also be affixed by some other kind of connection, for example by means of an adhesive bond or by means of a snap-in device or locking device.

The cover 7 is spaced apart from the semiconductor chip 2 in the vertical direction. An intermediate space 71 between the semiconductor chip and the cover 7 forms a free propagation region for the emitted radiation. By means of the optical element, the radiation can be narrowed into an even narrower solid angle. In addition, the cover can provide mechanical protection and protection against other external environmental influences, such as dust or moisture, for the semiconductor chip. By suitable selection of the optical element, the radiation characteristic of the semiconductor device can be matched in a simple way to the given requirements.

Figure 3A:
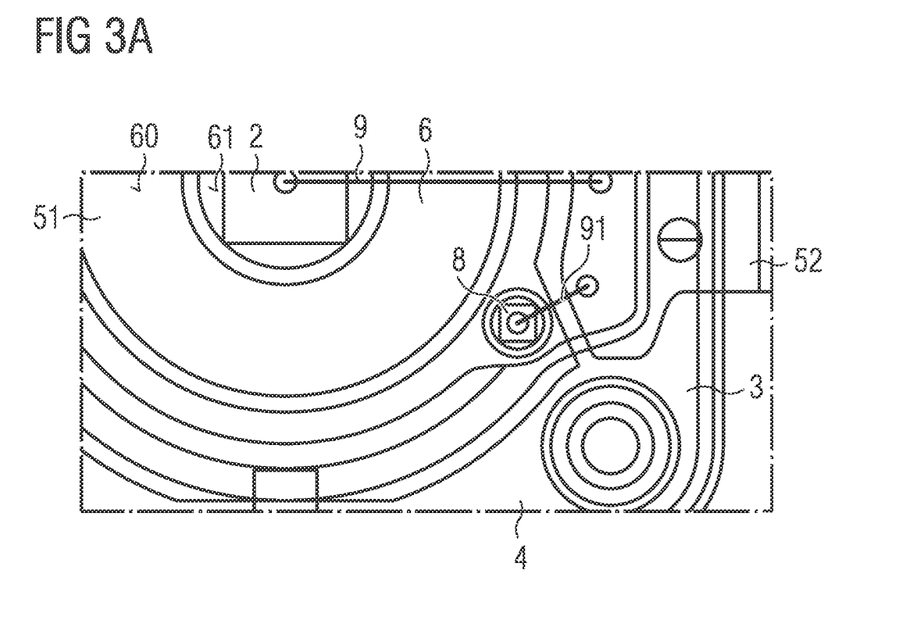
Figure 3B:
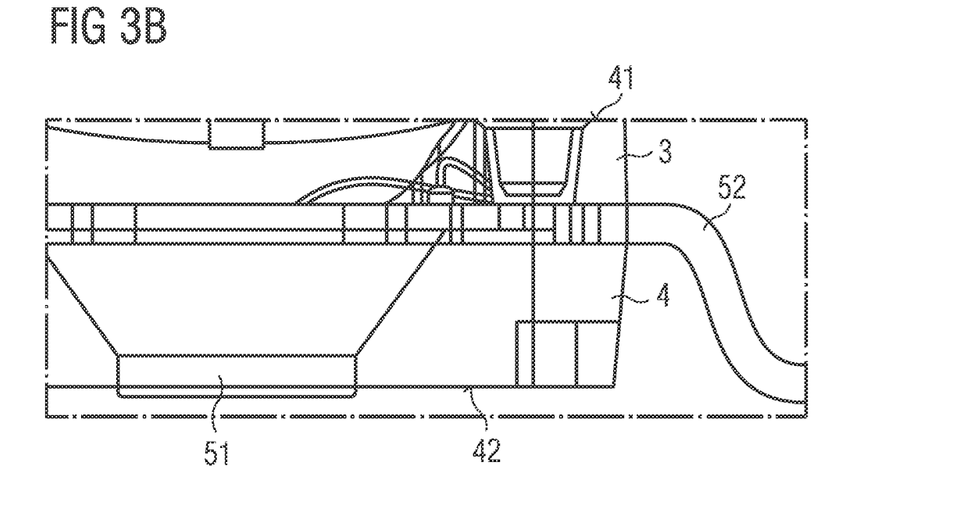

FIGS. 3A and 3B show a third exemplified embodiment of a semiconductor device with reference to an enlarged detail shown in plan view (FIG. 3A) and an associated sectional view (FIG. 3B). This exemplified embodiment differs from the exemplified embodiment described in conjunction with FIGS. 1A and 1B in that the semiconductor device has an ESD protection element 8. The ESD protection element is, by way of example, affixed to the first connection conductor 51 and is electrically conductively connected to the second connection conductor 52 via a further connecting lead 91. For example, the ESD protection element 8 is a semiconductor diode the throughput direction of which is arranged antiparallel with respect to the throughput direction of the semiconductor chip 2 provided for generating radiation. It will be understood that such an ESD protection element can also be used in the exemplified embodiment described in conjunction with FIGS. 2A and 2B.

Figure 4A:
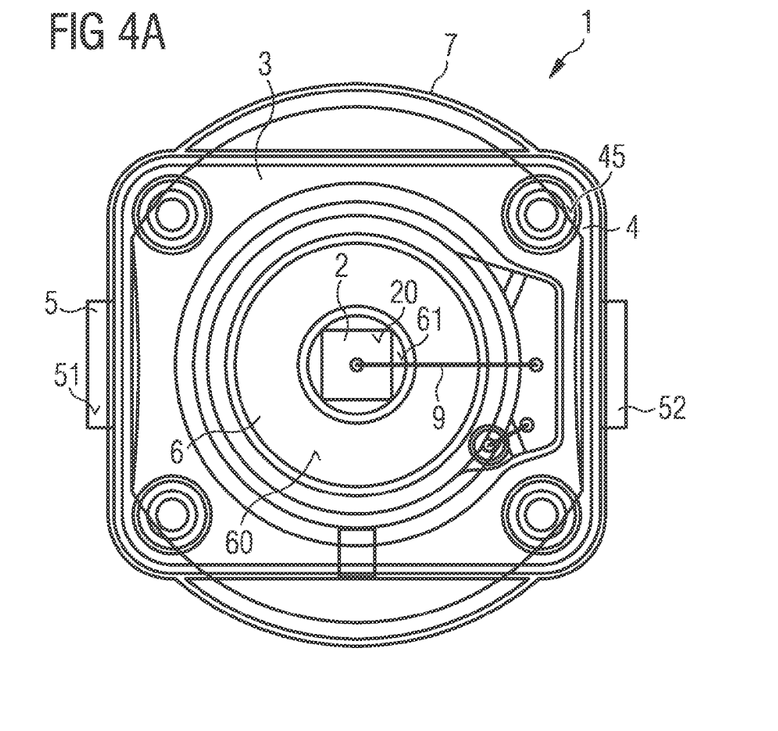
Figure 4B:
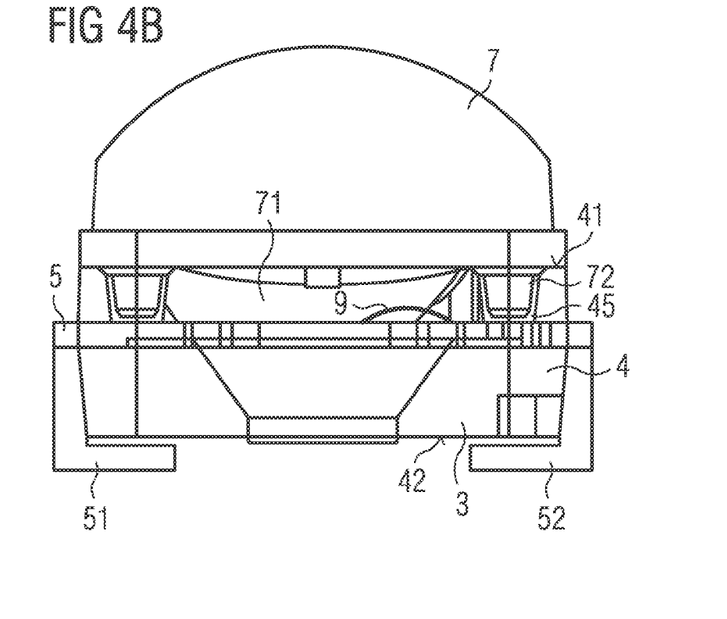

The fourth exemplified embodiment of a semiconductor device, illustrated in FIGS. 4A and 4B, differs from the second exemplified embodiment described in conjunction with FIGS. 2A and 2B in that the first connection conductor 51 and the second connection conductor 52 are each shaped so that the housing body 4 in some regions in plan view covers the portion of the connection conductors protruding from the housing body 4. Such a configuration of the connection conductors reduces the area required for mounting and electrical contacting on the connection carrier when the semiconductor device is affixed.

Figure 5A:
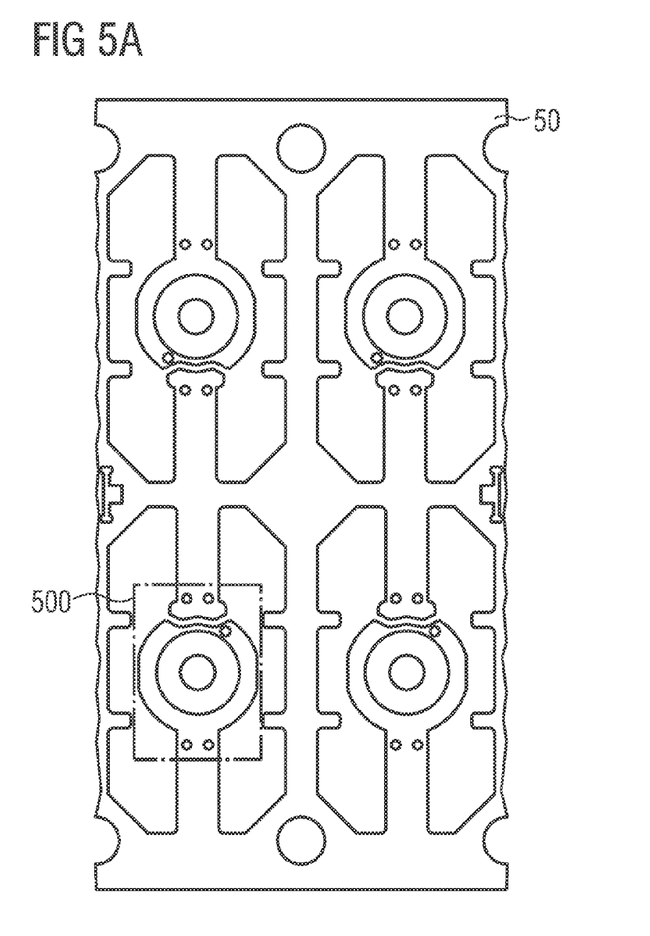
FIGS. 5A and 5B show an exemplified embodiment of a leadframe assemblage in a diagrammatic plan view (FIG. 5A) and an associated sectional view (FIG. 5B).
Figure 5B:
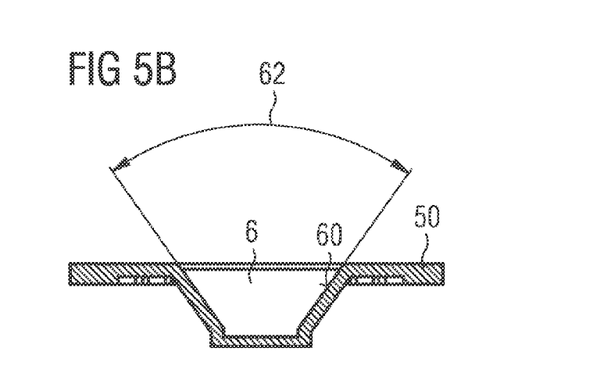

FIGS. 5A and 5B show an exemplified embodiment of a leadframe assemblage. The leadframe assemblage 50 has a plurality of device regions 500. Each device region comprises a first connection conductor 51 and a second connection conductor 52. In the leadframe assemblage the first connection conductors and the second connection conductors are still mechanically joined to one another outside the device region. To produce the leadframe assemblage, a base material for the leadframe assemblage, for example a copper sheet, can be provided with recesses. For that purpose a deep-drawing process may be used, especially impact extrusion. The first connection conductors 51 and the second connection conductors 52 are also formed from the base material, for example by stamping. The connection conductors can be formed before or after the recesses are formed.

To increase reflectivity, the base material can be provided with a coating. In some embodiments, the coating is formed after the recesses have been formed. By means of the coating, the side face 60 is in the form of a reflector. For example, the coating can comprise silver or can consist of silver.

To form the housing for optoelectronic semiconductor devices, the leadframe assemblage can in some regions be overmolded with a molding compound so that a housing body 4 is formed in each device region, which housing body can be configured as described in conjunction with FIGS. 1A and 1B. The overmolding can be effected, for example, by means of injection molding or transfer molding.

To form individual housings, the leadframe assemblage is severed between adjacent device regions 500. On the first connection carriers 51, to produce optoelectronic semiconductor devices, semiconductor chips 2 can be affixed to the first connection conductors 51, so that an above-described semiconductor device is formed. It is also conceivable for the leadframe assemblage to be singulated only once the semiconductor chips have been affixed to the leadframe assemblage 50.

The described method provides a simple and reliable way of manufacturing a leadframe of a form which allows both efficient thermal linkage of the semiconductor chips affixed thereto and beam-shaping of the radiation emitted by the semiconductor chips.

The description of the invention with reference to the exemplified embodiments does not limit the invention thereto; rather the invention encompasses any novel feature and any combination of features, including in particular any combination of features in the patent claims, even if that feature or that combination is not itself explicitly defined in the patent claims or exemplified embodiments.

The invention claimed is:
1. An optoelectronic semiconductor device, comprising:
a housing having a leadframe with a first connection conductor and a second connection conductor, wherein the housing further has a housing body which surrounds the leadframe in one or more regions, the housing body extending in a vertical direction between a mounting side of the housing body and a front side of the housing body opposite the mounting side, wherein the first connection conductor has a recess; and a semiconductor chip configured to generate radiation and arranged within the housing, wherein the semiconductor chip is disposed in the recess and affixed to the first connection conductor within the recess;

wherein a side face of the recess forms a reflector for reflecting the radiation generated by the semiconductor chip during operation;

wherein the first connection conductor protrudes from the housing body at the mounting side; and wherein the semiconductor chip is free of an encapsulation material on a radiation exit surface remote from the mounting side.

2. The optoelectronic semiconductor device according to claim 1, wherein a thickness of the leadframe in a region of the side face of the recess is smaller than in a region of a base surface of the recess.

3. The optoelectronic semiconductor device according to claim 1, wherein the first and second connection conductors are configured so that the optoelectronic semiconductor device is surface-mountable.

4. The optoelectronic semiconductor device according to claim 1, wherein a vertical dimension of the recess is at least three times as great as a vertical dimension of the semiconductor chip.

5. The optoelectronic semiconductor device according to claim 1, wherein opposing side faces of the recess form an opening angle of between 60° and 80°, inclusive.

6. The optoelectronic semiconductor device according to claim 1, wherein the housing body has at least one fixing device disposed on the front side, the at least one fixing device configured for attachment of a cover.

7. The optoelectronic semiconductor device according to claim 1, further comprising a cover through which radiation generated in the semiconductor chip exits the recess.

8. The optoelectronic semiconductor device according to claim 7, wherein the cover is a prefabricated optical element.

9. The optoelectronic semiconductor device according to claim 7, wherein an intermediate space between the semiconductor chip and the cover is free of solid matter.

10. The optoelectronic semiconductor device according to claim 1, further comprising an electrostatic discharge (ESD) protection element.

11. A method, comprising:
providing a base material for a leadframe assemblage having a plurality of device regions;
forming recesses in the base material using a deep-drawing process, each of the recesses disposed in one of the plurality of device regions;
forming connection conductors, so that each of the plurality of device regions has a first connection conductor and a second connection conductor associated with the respective device region;
producing a plurality of housings for optoelectronic semiconductor devices by overmolding one or more regions of the leadframe assemblage with a molding compound to form housing bodies;
positioning semiconductor chips with each of the semiconductor chips positioned in a respective housing of the plurality of housings; and
singulating the leadframe assemblage into a plurality of separate structures so that each structure of the plurality of separate structures has a housing of the plurality of housings, wherein, after the singulating, each housing has at least one of the housing bodies, wherein, after the singulating, each housing further has a leadframe having a first connection conductor and a second connection conductor and wherein, after the singulating, each of the semiconductor chips are free of an encapsulation material on a radiation exit surface.

12. The method according to claim 11, wherein the forming the recesses comprises forming the recesses by impact extrusion.

13. The method according to claim 11, wherein a vertical dimension of the recess is at least three times as great as a vertical dimension of the semiconductor chip.

14. An optoelectronic semiconductor device, comprising:
a housing having a leadframe having a first connection conductor and a second connection conductor, the housing further having a housing body which surrounds at least one region of the leadframe, the housing body extending in a vertical direction between a mounting side of the housing body and a front side of the housing body opposite the mounting side, wherein the first connection conductor has a recess;
a semiconductor chip configured to generate radiation and arranged in the housing, wherein the semiconductor chip is disposed in the recess and affixed to the first connection conductor within the recess;
a cover through which radiation generated in the semiconductor chip exits the recess;
wherein a side face of the recess forms a reflector for reflecting the radiation generated by the semiconductor chip during operation;
wherein the first connection conductor protrudes from the housing body at the mounting side; and
wherein an intermediate space between the semiconductor chip and the cover is free of solid matter.

* * * * *